(12) United States Patent
Wang et al.

(10) Patent No.: US 7,060,400 B2
(45) Date of Patent: Jun. 13, 2006

(54) METHOD TO IMPROVE PHOTOMASK CRITICAL DIMENSION UNIFORMITY AND PHOTOMASK FABRICATION PROCESS

(75) Inventors: Wen-Chuan Wang, Taipei (TW);
Shih-Ming Chang, Hsinchu (TW);
Chih-Chen Chin, Junghe (TW);
Chi-Lun Lu, Hsinchu (TW);
Sheng-Chi Chin, Hsinchu (TW);
Hung-Chang Hsieh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 288 days.

(21) Appl. No.: 10/637,347

(22) Filed: Aug. 8, 2003

(65) Prior Publication Data
US 2005/0031966 A1    Feb. 10, 2005

(51) Int. Cl.
*G01F 9/00* (2006.01)
(52) U.S. Cl. .......................................... 430/5
(58) Field of Classification Search ............... 430/5, 430/296
See application file for complete search history.

(56) References Cited

U.S. PATENT DOCUMENTS

| 4,411,972 | A | 10/1983 | Narken et al. |
|---|---|---|---|
| 4,774,164 | A | 9/1988 | Peavey et al. |
| 5,164,790 | A | 11/1992 | McNeil et al. |
| 6,627,366 | B1 * | 9/2003 | Yang .......................... 430/30 |
| 6,774,365 | B1 * | 8/2004 | Okoroanyanwu et al. ... 250/311 |
| 2002/0177047 | A1 | 11/2002 | Park |
| 2003/0044694 | A1 | 3/2003 | Kang |

* cited by examiner

*Primary Examiner*—S. Rosasco
(74) *Attorney, Agent, or Firm*—Duane Morris LLP

(57) ABSTRACT

A method of fabricating a photomask having improved critical dimension (CD) uniformity that meets or exceeds 90 nanometer technology requirements. The method includes the steps of: providing a transparent substrate covered with a layer of opaque material and a layer of photoresist; patterning the layer of photoresist to expose an area of the layer of opaque material that has a shape that follows a contour of a main pattern area to be defined by the layer of opaque material; removing the exposed area to define the layer of opaque material into the main pattern area and an area that surrounds the main pattern area; removing the patterned layer of photoresist; and removing the surrounding area of the layer of opaque material.

26 Claims, 4 Drawing Sheets

METHOD TO IMPROVE PHOTOMASK CRITICAL DIMENSION UNIFORMITY AND PHOTOMASK FABRICATION PROCESS

FIELD OF THE INVENTION

The present invention relates to semiconductor device fabrication and, more particularly, to a method of fabricating a line pattern dominant photomask with improved critical dimension (CD) uniformity.

BACKGROUND OF THE INVENTION

Fabricating integrated circuits with faster and/or an increasing number of semiconductor devices is a continuing trend in integrated circuit technology. A very influential factor in this trend is technology scaling, i.e., the reduction in transistor feature sizes. Technology scaling has enabled transistors to become smaller, thus allowing for more dense integrated circuits in terms of the number of transistors packed on a chip.

Semiconductor devices are formed by performing a sequence of different processes on a semiconductor wafer. Some of these processes include doping, etching, oxidizing, or depositing various layers. Typically, only selected portions of the wafer are subjected to these processes at any given stage of fabrication.

The processing of selected portions of a semiconductor wafer can be accomplished using well known lithographic methods. In such methods, a photomask is used to transfer a desired pattern to the semiconductor wafer. The photomask may be a patterned chrome layer overlying a quartz substrate.

The pattern features of photomasks are becoming progressively smaller so as to keep up with the demand for more dense integrated circuits. These smaller pattern features are currently formed by a photomask fabrication method that employs electron-beam (e-beam) lithography, using positive or negative resists, dry etching and critical dimension scanning electron microscopy (CDSEM).

As is well known, the term critical dimension (CD) refers to the size of the smallest geometrical feature which can be formed during semiconductor device/circuit manufacturing using a given technology. The photomask fabrication method described above has many problems achieving CD uniformity requirements for 90 nanometer and smaller mask technology. Specifically, during e-beam lithography, local CD errors are induced by proximity effects, and global CD errors are caused by vacuum and heating effects. Global and local CD errors also occur during mask development and etching due to pattern loading differences and trench linearity problems. During CDSEM, where a negative resist has been used during e-beam lithography, the numerous non-conducting areas (the areas of the mask where the quartz substrate has been exposed by removal of the chrome layer) of the photomask become statically charged during handling, which causes CD measurement problems. The static charging also attracts dust and other particles to the photomask, which due to the high pattern density and the large size of the wafer dies, increases the probability of fatal defects in the individual wafers, thus resulting in lower process yields.

Accordingly, a photomask fabrication method is needed which is capable of achieving CD uniformity requirements of 90 nanometer or higher mask technology while eliminating or minimizing the above problems.

SUMMARY OF THE INVENTION

A method is disclosed herein for fabricating a photomask having improved critical dimension (CD) uniformity. The method comprises the steps of: providing a transparent substrate covered with a layer of opaque material and a layer of photoresist; patterning the layer of photoresist to expose an area of the layer of opaque material that has a shape that follows a contour of a main pattern area to be defined by the layer of opaque material; removing the exposed area to define the layer of opaque material into the main pattern area and an area that surrounds the main pattern area; removing the patterned layer of photoresist; and removing the surrounding area of the layer of opaque material.

DETAILED DESCRIPTION

The present invention is a method of fabricating a line pattern dominant photomask with improved critical dimension (CD) uniformity that meets or exceeds 90 nanometer technology requirements. The method of the invention also resolves the problem of CD measurement and defect issues associated with convention mask fabrication methods.

Figure 1A:
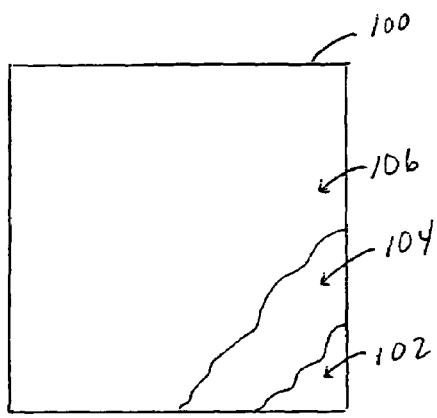
FIGS. 1A–1H are plan views illustrating a first embodiment of the method of the present invention.
Figure 1B:
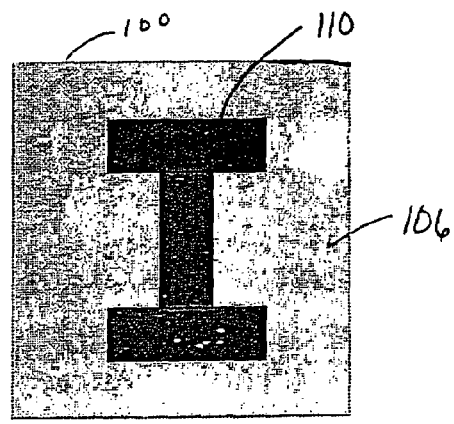

FIGS. 1A–1H illustrate a first embodiment of the method of the present invention, wherein a positive photoresist is used to fabricate a line pattern dominant photomask. As shown in FIG. 1A, the method of the first embodiment commences with a transparent substrate 100 covered on a first side 102 with a first layer 104 of opaque material, and a second layer 106 of positive photoresist material. The substrate 100 is typically composed from quartz or glass, and may have a thickness of about 0.25 inches. The first layer 104 of opaque or light blocking material may be composed of chrome, chrome oxide, iron oxide, nickel or like masking material, and may have a thickness of about 700 angstroms. The second layer 106 of positive photoresist may be a chemically amplified resist, and may have a thickness of 3000 to approximately 4000 angstroms. If the mask is a phase shift mask, there may be a shifter layer (not shown), such as molybdenum silicide (MoSi), between the transparent substrate 100 and the layer 104 of opaque material.

FIG. 11B shows a main geometrical pattern area 110 to be defined in the positive photoresist layer 106. The main pattern area 110 may be created in the photoresist layer 106 using an electron-beam (e-beam) writer. The e-beam writer generates a geometrically constrained stream of electrons that irradiate selected areas of the photoresist. One of ordinary skill in the art will recognize that any other suitable writer may be used for irradiating selected areas of the photoresist layer 106. In the case of positive photoresist, the irradiated areas are made soluble in developer and the non-irradiated areas remain insoluble in developer.

Figure 1C:
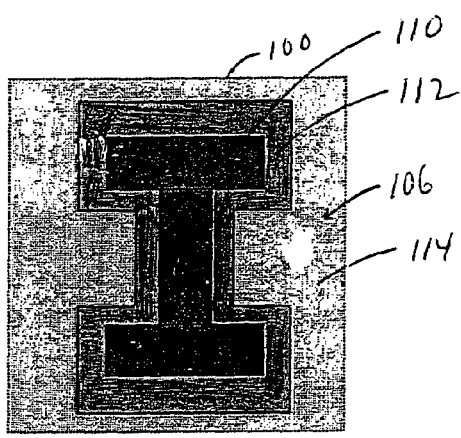

In FIG. 1C, the e-beam writer is used to irradiate a frame-like area 112 of the photoresist layer 106, that follows the profile or contour of the main pattern area 110. This frame-like area or contour area 112 is written rigorously using a small shot size, i.e., generally a "spot" of electrons with a specified shape and size, and multiple passes, e.g., four passes, to reduce stitching and heating effects and maximize the CD performance of the main pattern 110. Such rigorous writing methods are well known in the art. The irradiation makes the contour area 112 of the positive photoresist layer 106 soluble in developer, whereas the non-irradiated main pattern area 110 and surrounding area 114 of the positive photoresist layer 106 remain insoluble in developer.

After writing the main pattern area 110 to the photoresist layer 106, the substrate 100 may be conventionally processed by sequentially performing the steps of post exposure baking, developing, dry etching, and photoresist stripping. The post exposure baking process quenches or activates the positive photoresist layer 106.

Figure 1D:
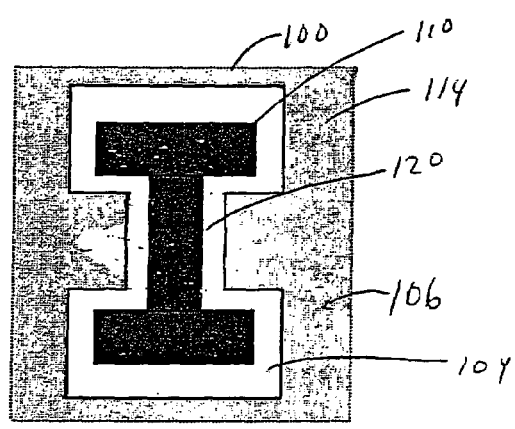

As shown in FIG. 1D, the developing process removes the soluble contour area 112 of the photoresist layer 106, thereby exposing an area 120 of the underlying opaque layer 104. The dry etching process removes the exposed area 120 of the opaque layer 104 from the substrate 100, thereby exposing an area 130 of the first side 102 of the substrate 100. The photoresist stripping process removes areas 110 and 114 of the photoresist layer 106 from the substrate 100.

Figure 1E:
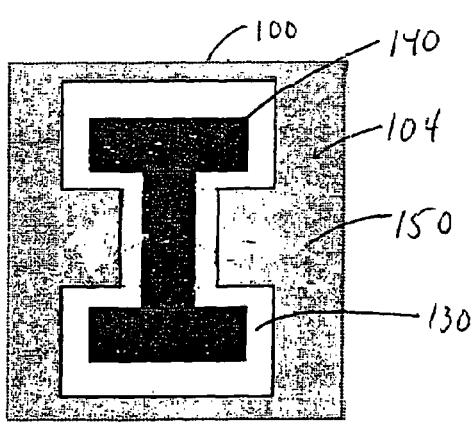

FIG. 1E shows the substrate 100 after post exposure baking, developing, dry etching, and photoresist stripping. As can be seen, the opaque layer 104 now defines a main pattern area 140 and a surrounding area 150 which will be removed further on after measuring the CD of the main pattern area 140. The exposed area 130 of the first side 102 of the substrate 100 is visible between the main pattern area 140 and surrounding area 150 of the opaque layer 104.

Figure 1F:
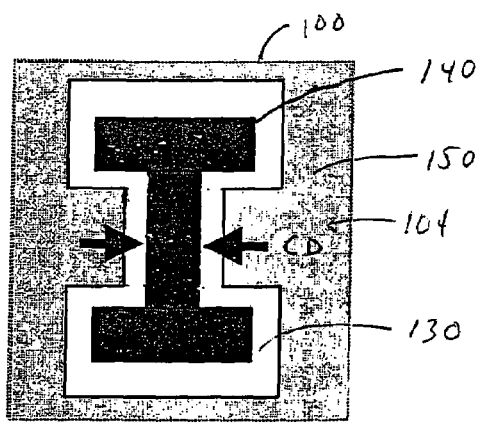

Referring to FIG. 1F, the CD of the main pattern area 140 is measured using conventional techniques, such as CDSEM. The CD measurement is advantageously performed at this stage of the method because the surrounding area 150 of the opaque layer 104 enhances the conductivity and reduces the charging effect during CDSEM.

Figure 1G:
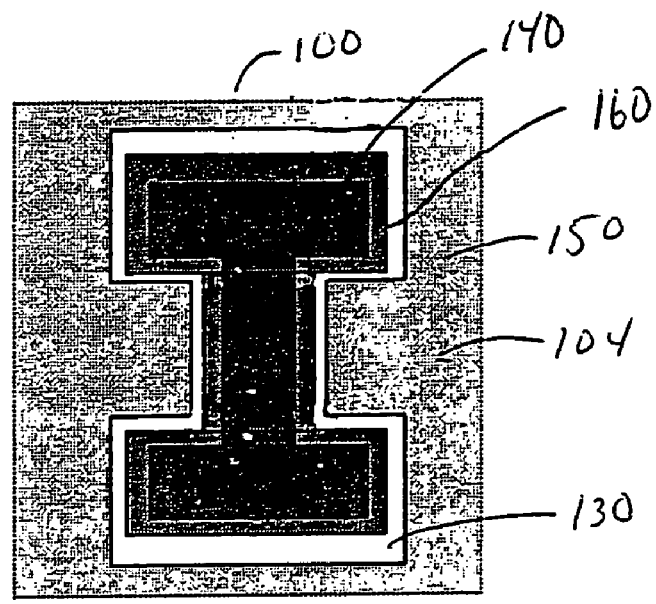

In FIG. 1G, a second layer 160 of photoresist has been formed over the substrate 100 and patterned conventionally to cover the main pattern area 140 of the opaque layer 104. The second layer 160 of photoresist may be a positive or negative photoresist and preferably a positive or negative optical photoresist, as it is less expensive to use because it is written with a less expensive optical exposure process (as compared with the e-beam writer process). The patterned second layer 160 of photoresist should slightly overlap the main pattern area 140 to ensure that it is protected.

The surrounding area 150 of the opaque layer 104 is then removed from the substrate 100 using a dry etching process, or preferably, a less expensive wet etching process. After etching, the second layer of photoresist 160 is removed from the substrate 100 using any conventional photoresist stripping technique.

Figure 1H:
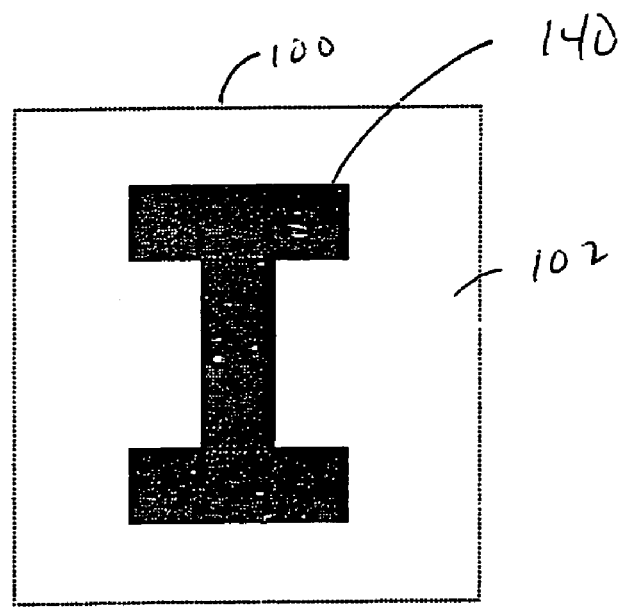

FIG. 1H shows the completed mask after removing the surrounding area 150 of the opaque layer 104 and the patterned second layer 160 of photoresist from the substrate 100. As can be seen, only the main pattern area 140 of the opaque layer 104 remains on the first side 102 of the substrate 100.

Figure 2A:
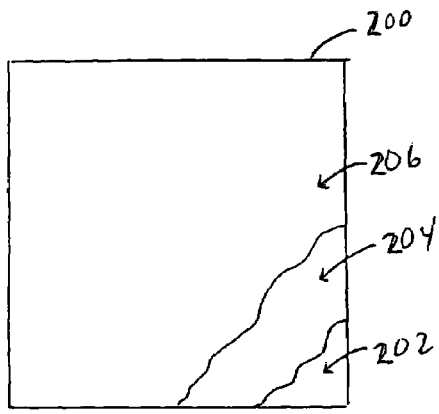
FIGS. 2A–2H are plan views illustrating a second embodiment of the method of the present invention.

FIGS. 2A–2H illustrate a second embodiment of the method of the present invention, wherein a negative photoresist is used to fabricate a line pattern dominant photomask. As shown in FIG. 2A, the method of the second embodiment commences with a transparent substrate 200 covered on a first side 202 with a first layer 204 of opaque material, and a second layer 206 of negative photoresist material. As in the first embodiment, the substrate 200 may be composed from quartz or glass, and may have a thickness of about 0.25 inches, and the first layer 204 of opaque or light blocking material may be composed of chrome, chrome oxide, iron oxide, nickel or like masking material, and may have a thickness of about 700 angstroms. The second layer 206 of negative photoresist may be a chemically amplified resist, and may have a thickness of 3000 to approximately 4000 angstroms. As in the first embodiment, if the mask is a phase shift mask, there may be a shifter layer (not shown), such as MoSi, between the transparent substrate 200 and the layer 204 of opaque material.

Figure 2B:
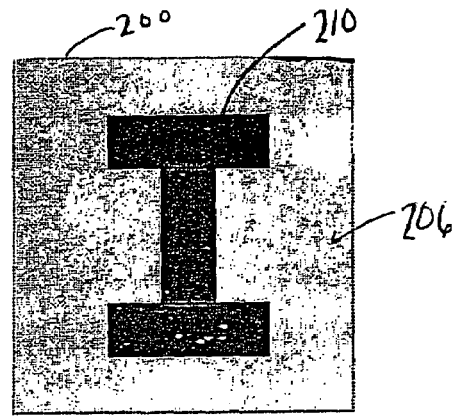

FIG. 2B, shows a main geometrical pattern area 210 to be defined in the negative photoresist layer 206. As in the first embodiment, the main pattern area 210 in the second embodiment may be created in the photoresist layer 206 using electron-beam (e-beam) lithography. In the case of negative photoresist, the irradiated areas are made insoluble in developer and the non-irradiated areas remain soluble in developer.

Figure 2C:
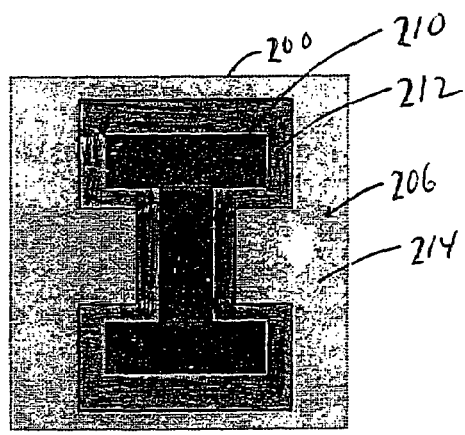

In FIG. 2C, the e-beam writer is used to irradiate the main pattern area 210 of the photoresist layer 206 and a surrounding area 214 of the photoresist layer 206. The frame-like area or contour region 212 which follows the contour of the main pattern area 210 is not irradiated. The main pattern area 210 is written rigorously using a small shot size and multiple passes, e.g., four passes, to reduce stitching and heating effects and maximize the CD performance of the main pattern. The surrounding area 214 is written less rigorously with one or two passes using a large shot size and as fast as possible. The irradiation makes the main pattern area 210 and surrounding area 214 of the negative photoresist layer 206 insoluble in developer whereas the non-irradiated contour area 212 of the negative photoresist layer 206 remains soluble in developer.

Figure 2D:
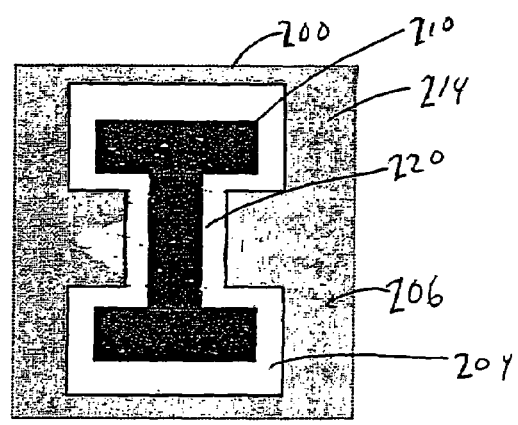

The remaining steps of the method of the second embodiment are the substantially the same as the first embodiment. The substrate 200 may be conventionally processed by sequentially performing the steps of post exposure baking, developing, dry etching, and photoresist stripping. The post exposure baking process quenches or activates the negative photoresist layer 206. The developing process removes the soluble contour area 212 of the photoresist layer 206, thereby exposing an area 220 of underlying opaque layer 204 as shown in FIG. 2D. The dry etching process removes the exposed area 220 of the opaque layer 204 from the substrate 200, thereby exposing an area 230 of the first side 202 of the substrate 200, and the photoresist stripping process removes areas 210 and 214 of the photoresist layer 206 from the substrate 200 as shown in FIG. 2E.

Figure 2E:
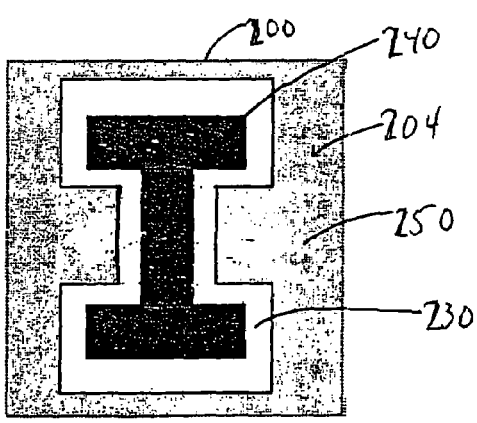

Referring still to FIG. 2E, as in the first embodiment, the opaque layer 204 now defines a main pattern area 240, and a surrounding area 250 which will be removed further on after measuring the CD of the main pattern area 240. The exposed area 230 of the first side 202 of the substrate 200 is visible between the main pattern area 240 and surrounding area 250 of the opaque layer 204.

Figure 2F:
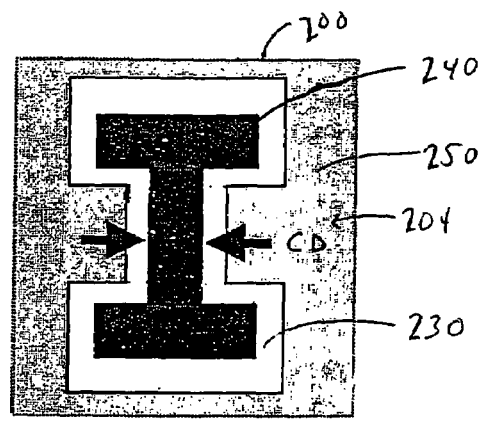

Referring to FIG. 2F, the CD of the main pattern area 240 is measured using conventional techniques.

Figure 2G:
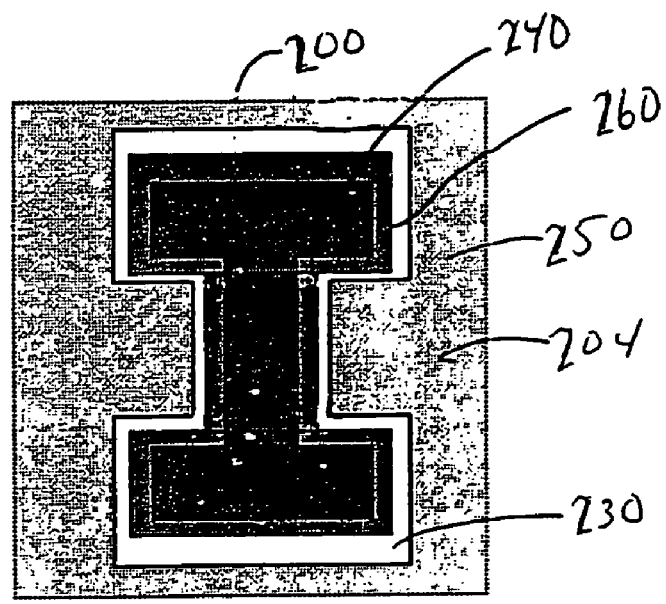

In FIG. 2G, a second layer 260 of positive or negative photoresist and preferably, a less expensive positive or negative optical photoresist, has been formed over the substrate 200 and patterned conventionally to cover the main pattern area 240 of the opaque layer 204. The patterned second layer 260 of photoresist should slightly overlap the main pattern area 240 to ensure that it is protected.

The surrounding area 250 of opaque layer 204 is then removed from the substrate 200 using a wet etching or similar process. After etching, the patterned second layer of photoresist 260 is removed from the substrate 200 using any conventional photoresist stripping technique.

Figure 2H:
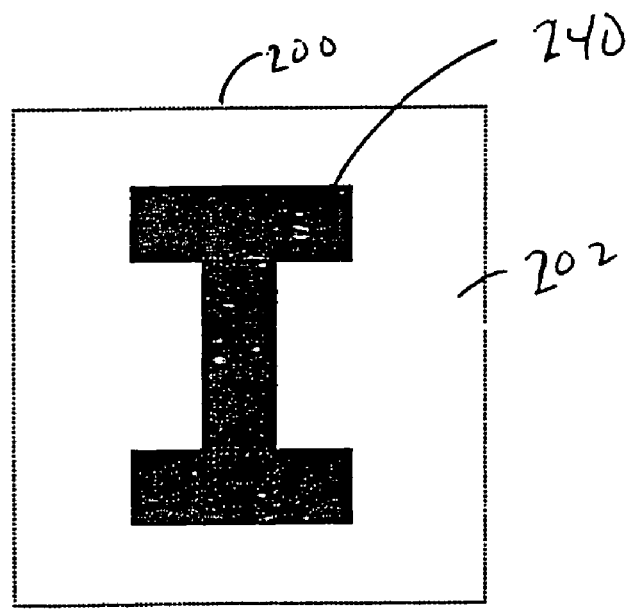

FIG. 2H shows the completed mask with only the main pattern area 250 of the opaque layer 204 remaining on the first side 202 of the substrate 200.

The method of the present invention improves CD uniformity through improvements in e-beam processing, baking, developing, and etching. E-beam processing is improved because proximity effects are minimize, as every pattern has almost the same duty ratio (for positive photoresist embodiments only). For embodiments using positive photoresist, global CD uniformity is improved because the vacuum effect is substantially resolved. Developing and etching are improved through a reduction in the loading effect, as the loading of the whole mask is almost the same.

The method of the present invention also makes measuring the CD of the photomask pattern easier because the opaque, e.g., chrome, layer coverage is greatly increased.

In addition, the method of the present invention reduces the probability of photomask related defects. This is due to the fact that the open area percentage (the exposed areas of the substrate) is very small before and during dry etching. Accordingly, the number of particles which fall onto the photomask is reduced. Moreover, the second etching step used in the present invention removes any particles which do find their way to "surrounding" area of the photomask during the mask making process.

While the foregoing invention has been described with reference to the above embodiments, various modifications and changes can be made without departing from the spirit of the invention. Accordingly, all such modifications and changes are considered to be within the scope of the appended claims.

What is claimed is:

1. A method of fabricating a photomask, the method comprising the steps of:
   providing a transparent substrate covered with a layer of opaque material and a layer of photoresist;
   patterning the layer of photoresist to expose an area of the layer of opaque material that has a shape that follows a contour of a main pattern area to be defined by the layer of opaque material;
   removing the exposed area to define the layer of opaque material into the main pattern area and an area that surrounds the main pattern area;
   removing the patterned layer of photoresist; and
   removing the surrounding area of the layer of opaque material.

2. The method according to claim 1, further comprising the step of measuring a critical dimension of the main pattern area prior to the step of removing the surrounding area of the layer of opaque material.

3. The method according to claim 2, wherein the measuring step is performed by critical dimension scanning electron microscopy.

4. The method according to claim 1, wherein the layer of photoresist comprises a negative photoresist.

5. The method according to claim 4, wherein the step of patterning the layer of photoresist is performed by irradiating only a main pattern area portion of the layer of photoresist and a surrounding area portion of the layer of photoresist.

6. The method according to claim 5, wherein the irradiating step is performed with an electron beam.

7. The method according to claim 6, wherein the main pattern area portion is irradiated rigorously and the surrounding area portion is irradiated substantially less rigorously than the main pattern area portion.

8. The method according to claim 5, wherein the main pattern area portion is irradiated rigorously and the surrounding area portion is irradiated substantially less rigorously than the main pattern area portion.

9. The method according to claim 1, wherein the step of patterning the layer of photoresist is performed by irradiating only a main pattern area portion of the layer of photoresist and a surrounding area portion of the layer of photoresist.

10. The method according to claim 9, wherein the irradiation step is performed with an electron beam.

11. The method according to claim 10, wherein the main pattern area portion is irradiated rigorously and the surrounding area portion is irradiated substantially less rigorously than the main pattern area portion.

12. The method according to claim 9, wherein the main pattern area portion is irradiated rigorously and the surrounding area portion is irradiated substantially less rigorously than the main pattern area portion.

13. The method according to claim 1, wherein the layer of photoresist comprises a positive photoresist.

14. The method according to claim 13, wherein the step of patterning the layer of photoresist is performed by irradiating only a contour area portion of the layer of photoresist.

15. The method according to claim 14, wherein the irradiation step is performed with an electron beam.

16. The method according to claim 15, wherein the contour area portion is irradiated rigorously.

17. The method according to claim 14, wherein the contour area portion is irradiated rigorously.

18. The method according to claim 1, wherein the step of patterning the layer of photoresist is performed by irradiating only a contour area portion of the layer of photoresist.

19. The method according to claim 18, wherein the irradiation step is performed with an electron beam.

20. The method according to claim 19, wherein the contour area portion is irradiated rigorously.

21. The method according to claim 18, wherein the contour area portion is irradiated rigorously.

22. The method according to claim 1, wherein the step of removing the surrounding area of the layer of opaque material comprises the steps of:
   forming another layer photoresist over the substrate;
   patterning the another layer of photoresist to cover the main pattern area of the layer of opaque material; and
   etching the surrounding area of the layer of opaque material.

23. The method according to claim 22, further comprising the step of removing the patterned another layer of photoresist to uncover the main pattern area of the layer of opaque material.

24. The method according to claim 1, wherein the transparent substrate is composed of one of quartz and glass.

25. The method according to claim 24, wherein the opaque material is chrome.

26. The method according to claim 1, wherein the opaque material is chrome.

* * * * *